US006571203B2

(12) United States Patent
Fujieda

(10) Patent No.: US 6,571,203 B2
(45) Date of Patent: May 27, 2003

(54) CAD-DATA MANAGEMENT SYSTEM HAVING A PLURALITY OF INTERFACES CORRESPONDING TO A PLURALITY OF CAD APPLICATIONS

(75) Inventor: Makoto Fujieda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/845,288

(22) Filed: May 1, 2001

(65) Prior Publication Data

US 2002/0083082 A1 Jun. 27, 2002

(30) Foreign Application Priority Data

Dec. 26, 2000 (JP) .......................................... 2000-395662

(51) Int. Cl.[7] ................................................ G06G 7/48
(52) U.S. Cl. ................................. 703/6; 703/1; 703/22; 703/3; 703/13; 703/14; 700/96; 700/182; 704/235; 707/1; 707/102; 711/118; 711/202; 711/203; 716/1; 716/5; 716/9; 716/10; 716/12; 716/19
(58) Field of Search ........................... 717/1, 5; 712/32; 711/118, 202, 203; 710/260; 716/10, 9, 1, 12, 5, 19; 703/3, 13, 14, 21, 1, 6, 22; 707/102, 1; 709/238; 700/182, 96; 704/235; 345/156, 100, 163, 173, 157, 184, 418, 419; 235/375; 257/300, 315

(56) References Cited

U.S. PATENT DOCUMENTS 5,689,711 A * 11/1997 Bardasz et al. ................ 717/1
5,907,494 A * 5/1999 Dangelo et al. ............... 703/1
6,063,128 A * 5/2000 Bentley et al. ................ 703/6

OTHER PUBLICATIONS

Goldman et al., "Tool interoperability is key to improved design quality", IEEE 2000 First International symposium on Quality electronic design, Mar. 2000.*
Sutton et al., "Framework encapsulations: a new approach to CAD tool interoperability", Proceedings of the Design automation conference, Jun. 1998.*
Arnold, "MACAO—ajourney into CAx interoperability and collaborative design", IEEE International conference on Information Visualization, Jul. 2000.*
Murray et al., "Issues and Answers in CAD Tool Interoperability", 33rd Design Automation Conference, ACM, Inc, 1996.*
Abstract of Japanese Patent No. 08137923, published May 31, 1996.

* cited by examiner

Primary Examiner—Samuel Broda, Esq.
Assistant Examiner—Kandasamy Thangavelu
(74) Attorney, Agent, or Firm—Staas & Halsey LLP

(57) ABSTRACT

In a CAD-data management system for managing a plurality of types of CAD data: a plurality of CAD-data processing units are capable of processing a plurality of predetermined types of CAD data, respectively: a processing-request generation unit receives a manipulation input designating CAD data of one of the plurality of types, and generates a processing request corresponding to the manipulation input and being directed to one of the plurality of CAD-data processing units which is capable of processing CAD data of the one of the plurality of types; and a linkage processing unit executes processing defined in a function in conjunction with the one of the plurality of CAD-data processing units, where the function is predefined corresponding to the processing request.

11 Claims, 14 Drawing Sheets

FUNCTION TABLE

COMPATIBLE COMMAND TABLE

CAD-DATA MANAGEMENT SYSTEM HAVING A PLURALITY OF INTERFACES CORRESPONDING TO A PLURALITY OF CAD APPLICATIONS

BACKGROUND OF THE INVENTION

1) Field of the Invention

The present invention relates to a CAD-data management system for processing a plurality of different types of CAD data, a method for managing a plurality of different types of CAD data, and a computer-readable storage medium which stores a program realizing the CAD-data management system for processing a plurality of different types of CAD data.

2) Description of the Related Art

In the field of machine drawing production, the three-dimensional CAD (Computer-Aided Design) is widely used. Currently, various types of three-dimensional CAD application software (hereinafter called CAD applications) are available in the market. Those CAD applications have individually unique functions. The data structures handled by the CAD applications are adapted for the unique functions of the CAD applications, respectively. In other words, the respective CAD applications generate CAD data having individually unique data structures. Further, individually different functions are added to the respective CAD applications when necessary. Therefore, it is impossible to achieve data compatibility between different types of CAD applications.

Generally, in order to manage different types of CAD data, each CAD data item is accompanied by an attribute which indicates the type of the CAD data item. When a CAD data item is accessed, the attribute is referred to in order to recognize the type of the CAD data item, and a CAD application corresponding to the recognized type is started. Then, the started CAD application loads the CAD data item, and the contents of the CAD data is displayed.

Manufacturers of machine parts are usually required to supply drawings of machine parts designated by customers, to the customers in the form of CAD data. When a manufacturer has a plurality of customers using a plurality of different CAD applications, the manufacturer is required to use the plurality of different CAD applications. Further, in each manufacturer, different divisions often use different CAD applications which are suitable for the respective divisions. Thus, usually, a plurality of different types of CAD data are concurrently used in a company. In the above situation, there are demands for integrated management of a plurality of different types of CAD data.

However, many CAD data items contain information indicating relationship between CAD data items, such as assembly information. In order to produce a system which enables integrated management of a plurality of different types of CAD data, it is necessary to enable loading of the plurality of different types of CAD data. Conventionally, in order to enable loading of a plurality of different types of CAD data, a plurality of APIs (Application Programming Interfaces) which are respectively unique to a plurality of CAD applications corresponding to the plurality of different types of CAD data must be used. Nevertheless, it takes a great amount of time to produce application software for integrated management a plurality of different types of CAD data, by using the above APIs. Therefore, a system which enables integrated management of a plurality of different types of CAD data, and can be easily produced is required.

SUMMARY OF THE INVENTION

An object of the present invention is to provide a method for managing a plurality of different types of CAD data in an efficient, integrated manner.

Another object of the present invention is to provide a CAD-data management system which enables integrated management of a plurality of different types of CAD data, and can be easily produced.

A further object of the present invention is to provide a computer-readable storage medium which stores a program realizing a CAD-data management system for managing a plurality of different types of CAD data in an efficient, integrated manner.

(1) According to the first aspect of the present invention, there is provided a method for managing CAD data by using a CAD-data processing function being capable of processing a predetermined type of CAD data, comprising the steps of: (a) receiving a manipulation input designating CAD data of the predetermined type; (b) generating a processing request corresponding to the manipulation input and being directed to the CAD-data processing function; and (c) executing processing defined in an interface function in conjunction with the CAD-data processing function, where the interface function is predefined corresponding to the processing request.

(2) According to the second aspect of the present invention, there is provided a method for managing a plurality of types of CAD data by using a plurality of CAD-data processing functions respectively capable of processing a plurality of predetermined types of CAD data, comprising the steps of: (a) receiving a manipulation input designating CAD data of one of the plurality of types; (b) generating a processing request corresponding to the manipulation input and being directed to one of the plurality of CAD-data processing functions which is capable of processing CAD data of the one of the plurality of types; and (c) executing processing defined in an interface function in conjunction with the one of the plurality of CAD-data processing functions, where the interface function is predefined corresponding to the processing request.

(3) According to the third aspect of the present invention, there is provided a CAD-data management system for managing CAD data, comprising: a CAD-data processing unit which is capable of processing a predetermined type of CAD data; a processing-request generation unit which receives a manipulation input designating CAD data of the predetermined type, and generates a processing request corresponding to the manipulation input and being directed to the CAD-data processing unit; and a linkage processing unit which executes processing defined in a function in conjunction with the CAD-data processing unit, where the function is predefined corresponding to the processing request.

(4) According to the fourth aspect of the present invention, there is provided a CAD-data management system for managing a plurality of types of CAD data, comprising: a plurality of CAD-data processing units which is capable of processing a plurality of predetermined types of CAD data; a processing-request generation unit which receives a manipulation input designating CAD data of one of the plurality of types, and generates a processing request corresponding to the manipulation input and being directed to one of the plurality of CAD-data processing units which is capable of processing CAD data of the one of the plurality of types; and a linkage processing unit which executes processing defined in a first function in conjunction with the one of the plurality of CAD-data processing units, where the first function is predefined corresponding to the processing request.

The CAD-data management system according to the fourth aspect of the present invention may have one or any possible combination of the following additional features (i) to (v).

(i) The CAD-data management system may further comprise a data-structure displaying unit which displays a data structure of a plurality of CAD data items so that a user can select at least a portion of the plurality of CAD data items as the CAD data designated by the manipulation input, and the processing-request generation unit recognizes the portion of the plurality of CAD data items based on the manipulation input.

(ii) The CAD-data management system may further comprise: a memory; a loading unit which loads in the memory a plurality of second functions including the first function and corresponding to a plurality of processing requests which can be generated by the processing-request generation unit; a pointer table; and a pointer registration unit which registers in the pointer table a plurality of pointers which respectively point to a plurality of locations in which the a plurality of second functions are loaded in the memory. The linkage processing unit locates the first function based on one of the plurality of pointers.

(iii) In the CAD-data management system having the feature (ii), the plurality of second functions may be contained in a plurality of modules corresponding to the plurality of CAD-data processing units, and the loading unit loads the plurality of modules in the memory.

(iv) In the CAD-data management system having the feature (iii), each of the plurality of modules may include a function of responding to an inquiry about a type of CAD data which one of the plurality of CAD-data processing units corresponding to the each of the plurality of modules can process.

(v) In the CAD-data management system having the feature (iv), the processing-request generation unit may output an inquiry about processing which can be executed by one of the plurality of CAD-data processing units, and display a menu on a screen according to a response to the inquiry, where the menu includes items of processing which the one of the plurality of CAD-data processing units can execute.

(5) According to the fifth aspect of the present invention, there is provided a computer-readable storage medium storing a program which is to be executed by a computer, and realizes a CAD-data management system for managing CAD data, comprising: a CAD-data processing unit which is capable of processing a predetermined type of CAD data; a processing-request generation unit which receives a manipulation input designating CAD data of the predetermined type, and generates a processing request corresponding to the manipulation input and being directed to the CAD-data processing unit; and a linkage processing unit which executes processing defined in a function in conjunction with the CAD-data processing unit, where the function is predefined corresponding to the processing request.

That is, the program stored in the computer-readable storage medium according to the fifth aspect of the present invention makes the computer realize the CAD-data management system according to the third aspect of the present invention.

(6) According to the sixth aspect of the present invention, there is provided a computer-readable storage medium storing a program which is to be executed by a computer, and realizes a CAD-data management system for managing a plurality of types of CAD data, comprising: a plurality of CAD-data processing units which is capable of processing a plurality of predetermined types of CAD data; a processing-request generation unit which receives a manipulation input designating CAD data of one of the plurality of types, and generates a processing request corresponding to the manipulation input and being directed to one of the plurality of CAD-data processing units which is capable of processing CAD data of the one of the plurality of types; and a linkage processing unit which executes processing defined in a first function in conjunction with the one of the plurality of CAD-data processing units, where the first function is predefined corresponding to the processing request.

That is, the program stored in the computer-readable storage medium according to the sixth aspect of the present invention makes the computer realize the CAD-data management system according to the fourth aspect of the present invention.

The computer-readable storage medium according to the sixth aspect of the present invention may have one or any possible combination of the aforementioned additional features (i) to (v).

According to the present invention, a function corresponding to a processing request which is output from the processing-request generation unit is predefined so that processing defined in the predefined function is executed in conjunction with a CAD-data processing unit to which the processing request is directed to. Thus, the requested processing can be performed by the CAD-data processing unit. In addition, according to the present invention, it is easy to add a new CAD data management function for an arbitrary type of CAD data.

The above and other objects, features and advantages of the present invention will become apparent from the following description when taken in conjunction with the accompanying drawings which illustrate preferred embodiment of the present invention by way of example.

DESCRIPTION OF THE PREFERRED EMBODIMENTS

Embodiments of the present invention are explained below with reference to drawings.

(1) Principle of Invention

Figure 1:
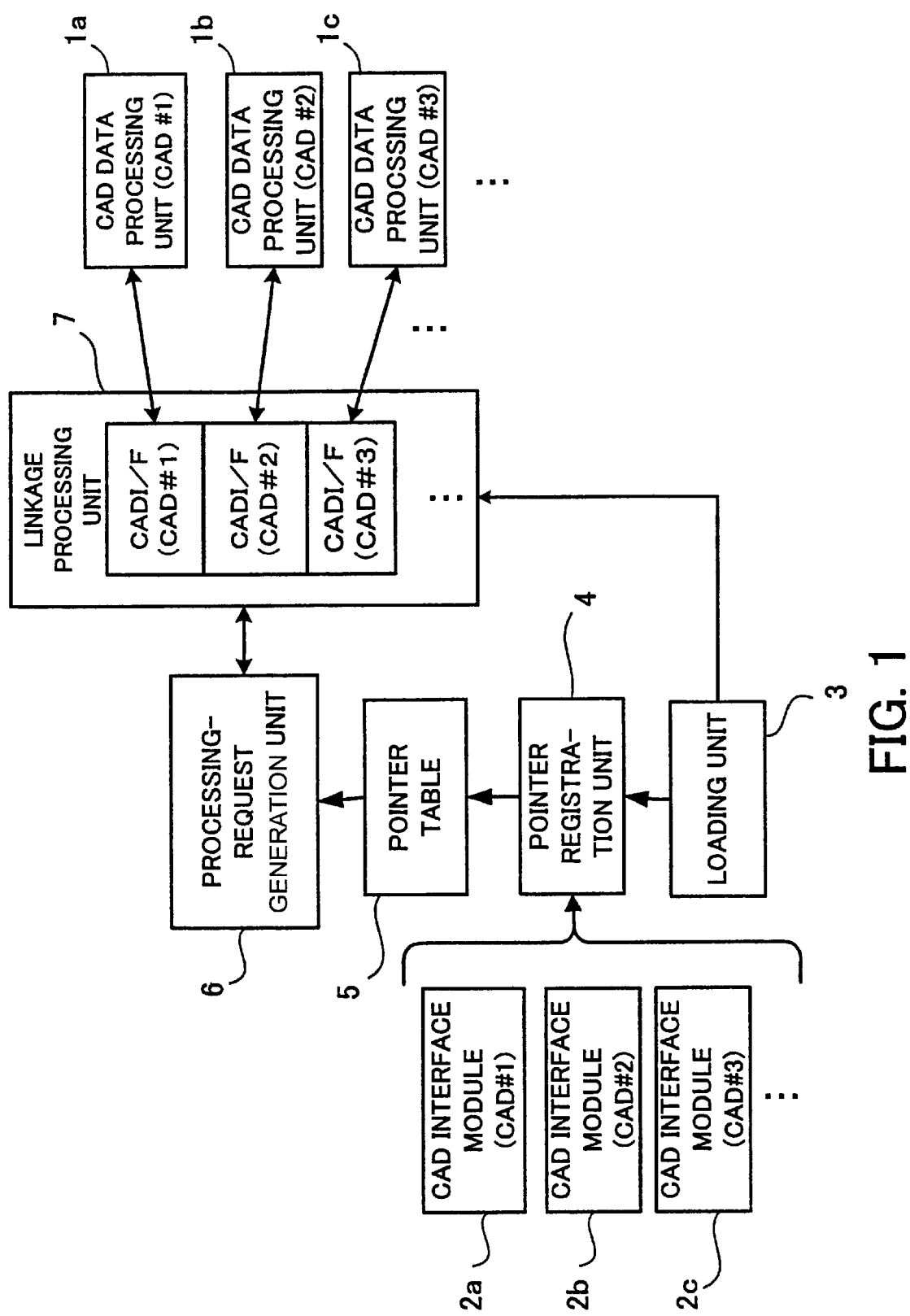
FIG. 1 is a diagram illustrating the principle of the present invention.

FIG. 1 is a diagram illustrating the principle of the present invention. In the construction of FIG. 1, the basic functions realized by a CAD-data management system according to the present invention (e.g., a computer which executes a program stored in a computer-readable storage medium according to the present invention) are indicated. The CAD-data management system according to the present invention manages a plurality of types of CAD data, and comprises a plurality of CAD-data processing units 1a, 1b, and 1c, a plurality of CAD interface modules 2a, 2b, and 2c, a loading unit 3, a pointer registration unit 4, a pointer table 5, a processing-request generation unit 6, and a linkage processing unit 7.

The plurality of CAD-data processing units 1a, 1b, and 1c correspond to different types of CAD data, respectively, and each of the plurality of CAD-data processing units 1a, 1b, and 1c has functions of generation, edition, and the like of a corresponding one of the different types of CAD data. For example, the plurality of CAD-data processing units 1a, 1b, and 1c have functions of the different CAD applications (e.g., three-dimensional CAD applications), respectively. The plurality of CAD interface modules 2a, 2b, and 2c are provided corresponding to the plurality of CAD-data processing units 1a, 1b, and 1c, respectively. In the plurality of CAD interface modules 2a, 2b, and 2c, a plurality of functions (methods) are defined corresponding to a plurality of processing requests which can be output from the processing-request generation unit 6.

The loading unit 3 loads the plurality of CAD interface modules 2a, 2b, and 2c in a memory so as to enable linkage processing by the linkage processing unit 7. The pointer registration unit 4 registers in the pointer table 5 a pointer which points to a location, in the memory, of each function loaded by the loading unit 3. When the processing-request generation unit 6 receives a user manipulation input which designates an item of CAD data, the processing-request generation unit 6 generates and outputs a processing request directed to one of the plurality of CAD-data processing units 1a, 1b, and 1c which is capable of processing the designated item of CAD data. In the linkage processing unit 7, a function corresponding to the processing request output from the processing-request generation unit 6 is defined in advance. The linkage processing unit 7 performs processing which is defined by the above function in conjunction with the one of the plurality of CAD-data processing units 1a, 1b, and 1c which is capable of processing the designated item of CAD data.

As described above, according to the present invention, the linkage processing unit 7 executes a function corresponding to a processing request output from the processing-request generation unit 6, in conjunction with one of the plurality of CAD-data processing units 1a, 1b, and 1c. Therefore, the user can make an appropriate one of the plurality of CAD-data processing units 1a, 1b, and 1c process a designated item of CAD data without awareness of the type of the designated item of CAD data. In other words, it is possible to issue processing requests for a plurality of types of CAD data by using an integrated user interface.

In addition, when functions to be loaded in the linkage processing unit 7 are prepared in the form of interface modules, the CAD-data management system can be easily adapted to addition of a new CAD-data processing unit. In this case, the functions in the linkage processing unit 7 can be prepared corresponding to processing requests which can be output from the processing-request generation unit 6. That is, a CAD interface module corresponding to the new CAD-data processing unit can also be defined corresponding to at least one processing request which can be newly output from the processing-request generation unit 6. The preparation of the CAD interface modules according to present invention is easier than the conventional preparation of an application adapted for API's defined in the respective CAD-data processing units.

(2) Example of Hardware Construction

Figure 2:
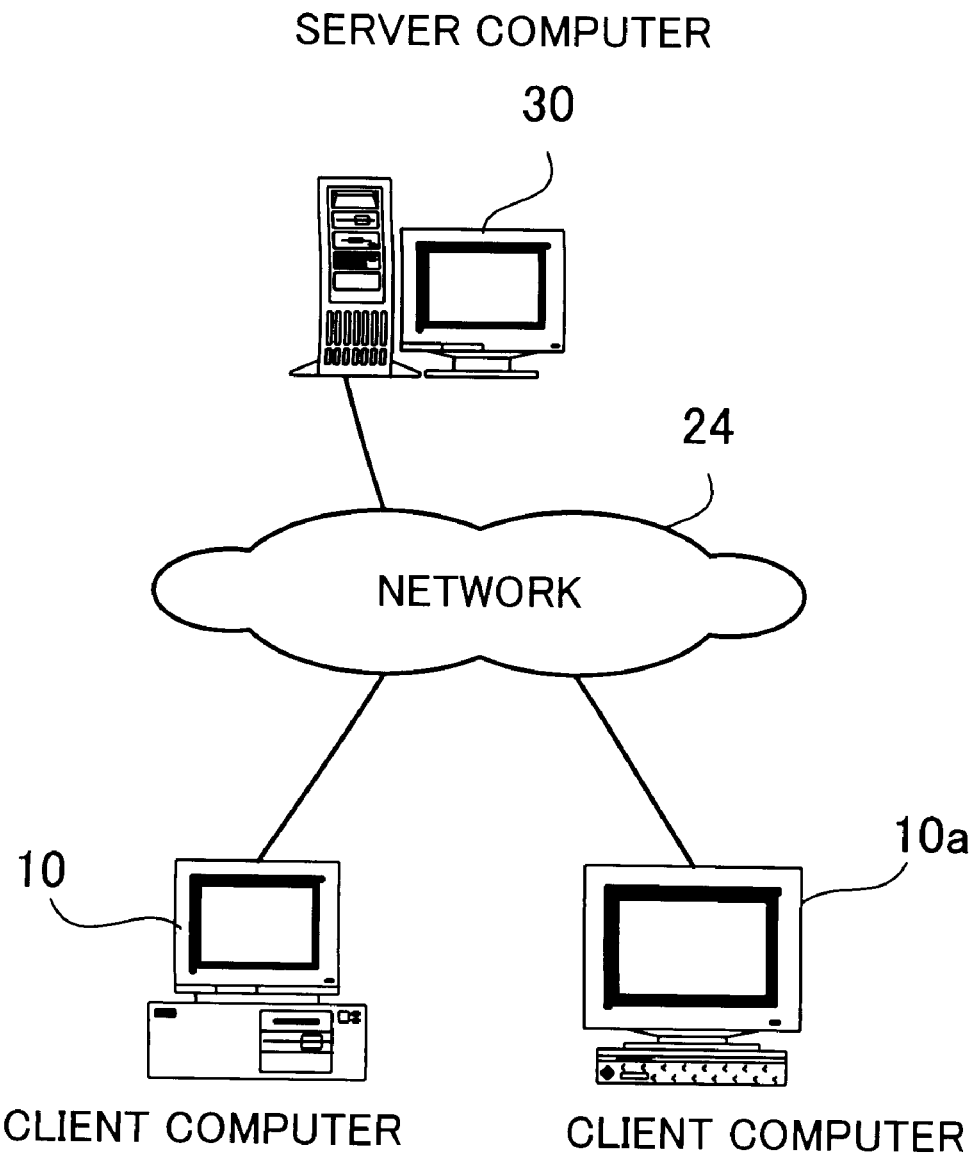
FIG. 2 is a diagram illustrating an exemplary construction of a CAD-data management system as an embodiment of the present invention.

FIG. 2 is a diagram illustrating an exemplary construction of the CAD-data management system as an embodiment of the present invention. In the example of FIG. 2, a plurality of client computers 10, 10a are connected to a server computer 30 through a network 24. For example, the network 24 is a local area network such as an intranet or a wide area network such as the Internet.

Figure 3:
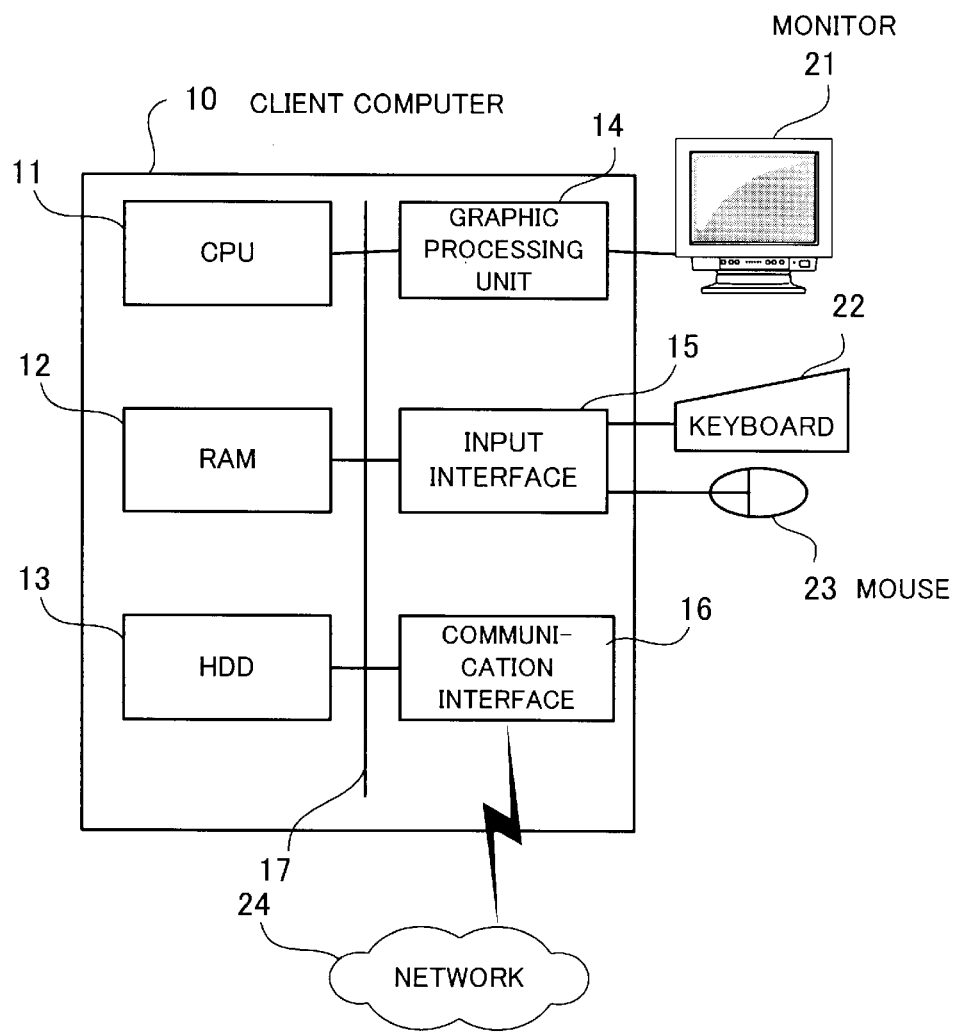
FIG. 3 is a diagram illustrating an exemplary construction of the client computer in an embodiment of the present invention

FIG. 3 is a diagram illustrating an exemplary construction of the client computer 10 in the embodiment of the present invention. The client computer 10 illustrated in FIG. 3 comprises a CPU (Central Processing Unit) 11, a RAM (Random Access Memory) 12, an HDD (Hard Disk Drive) 13, a graphic processing unit 14, an input Interface 15, and a communication interface 16, which are interconnected through a bus 17. The CPU 11 controls the respective portions of the client computer 10. The RAM 12 temporarily stores at least portions of an operating system (OS) and other programs relating to CAD, as well as data which are necessary for execution of the programs by the CPU 11. The HDD 13 stores the operating system (OS) and the above programs relating to CAD, as well as CAD data.

A monitor (display device) 21 is connected to the graphic processing unit 14, which controls the monitor 21 so as to display an image such as a CAD drawing in accordance with an instruction of the CPU 11. A keyboard 22 and a mouse 23 are connected to the input Interface 15, which transfers signals generated by the keyboard 22 and the mouse 23 to the CPU 11 through the bus 17. The communication interface 16 is connected to the network 24, e.g., a wide area network such as the Internet, and transmits data to and receives data from one of the other computers.

The server computer 30 has the basically the same hardware construction as the client computer 10 except that the HDD 13 in the server computer 30 stores three-dimensional CAD data so as to construct a database of CAD data. The server computer 30 behaves as a database server of CAD data.

The functions of the embodiment of the present invention can be realized by the above hardware construction.

(3) Functions of CAD-Data Management System

Figure 4:
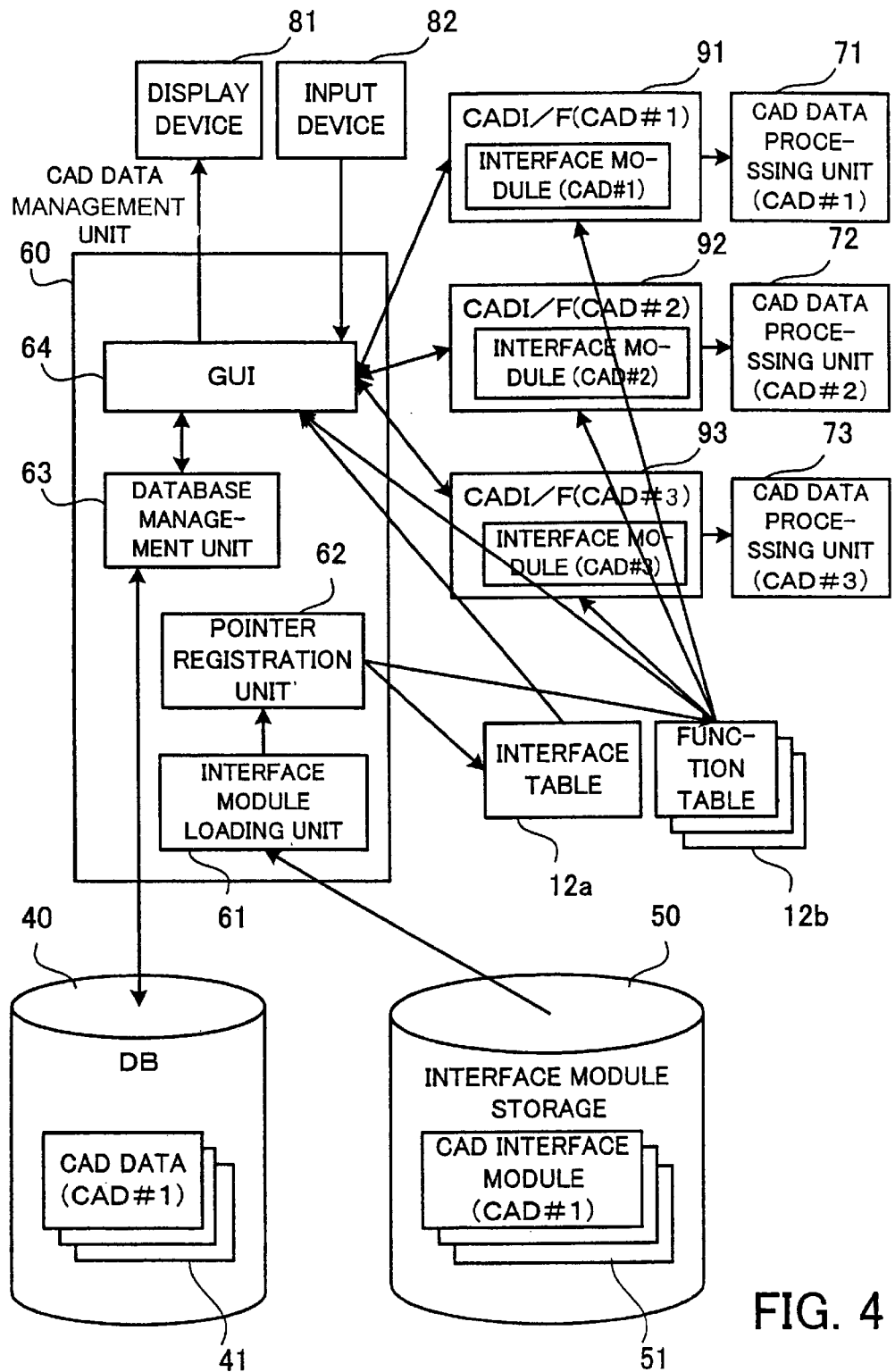
FIG. 4 is a diagram illustrating functions of the CAD-data management system in an embodiment of the present invention.

FIG. 4 is a diagram illustrating functions of the CAD-data management system as the embodiment of the present invention. The CAD-data management system of FIG. 4 comprises a database 40, an interface module storage 50, a CAD-data management unit 60, an interface table 12a, a plurality of function tables 12b, a plurality of CAD-data processing units 71 to 73, a display device 81, an input device 82, and a plurality of CAD interfaces 91 to 93. In the example of FIG. 4, a plurality of items of CAD data 41 are stored in the database 40. Each item of the CAD data 41 is generated by a specific CAD application, and has a data structure corresponding to the CAD application which generates the item of CAD data. The plurality of CAD-data processing units 71 to 73 are respectively provided corresponding to a plurality of CAD applications, and can generate and edit CAD data in accordance with the corresponding CAD application. The data structure of each item of CAD data 41 corresponds to one of the plurality of CAD-data processing units 71 to 73. That is, items of CAD data generated by different CAD applications or different ones of the plurality of CAD-data processing units 71 to 73 have different data structures. For example, the CAD data item "CAD#1" has a data structure corresponding to the CAD-data processing unit 71.

The interface module storage 50 stores a plurality of CAD interface modules 51 respectively corresponding to the plurality of CAD-data processing units 71 to 73. At least one function (method) of transferring a request from the CAD-data management unit 60 to a corresponding one of the plurality of CAD-data processing units 71 to 73 is defined in each of the plurality of CAD interface modules 51.

The CAD-data management unit 60 manages the CAD data 41 stored in the database 40. The display device 81 and the input device 82 are connected to the CAD-data management unit 60, and the CAD-data management unit 60 provides users with an environment for user manipulation so that users can control the database 40 by manipulating the input device 82 and/or the display device 81.

The CAD-data management unit 60 comprises an interface-module loading unit 61, a pointer registration unit 62, a database management unit 63, and a graphical user interface (GUI) 64.

When the CAD-data management unit 60 is started, the interface-module loading unit 61 loads in the RAM 12 at least one of the plurality of CAD interface modules 51 stored in the plurality of interface module storage 50, based on information held in a registry. The registry is a database storing information necessary for execution of the operating system (OS) and applications by the computer. In this case, the information referred to by the interface-module loading unit 61 indicates which CAD interface module should be loaded in the RAM 12. In this embodiment, it is assumed that information on the CAD interface modules 51 is set in the registry when the CAD interface modules are installed in the operating system (OS).

In addition, the interface-module loading unit 61 acquires the name, the storage location, and the like of each of the at least one of the plurality of CAD interface modules 51 from an environment setting file, and loads the at least one of the plurality of CAD interface modules 51 in the RAM 12. For example, the environment setting file has an extension "ini".

The pointer registration unit 62 monitors the loading operation performed by the interface-module loading unit 61, and recognizes at least one location (address) at which at least one function (method) in the at least one of the plurality of CAD interface modules 51 is stored in the RAM 12. Then, the pointer registration unit 62 generates an information set comprised of a name and the location (address) of each of at least one function (method) in the at least one of the plurality of CAD interface modules 51 which is loaded in the RAM 12, where the address is recognized as above. In addition, the pointer registration unit 62 produces a function table 12b which contains the above information set of the name and address of each function (method) in the at least one of the plurality of CAD interface modules 51 loaded in the RAM 12, and stores the produced function table 12b in the RAM 12. Further, the pointer registration unit 62 obtains an address at which the produced function table 12b is stored in the RAM 12, and registers in the interface table 12a an information set comprised of the type of the CAD interface module loaded in the RAM 12 and the address of the produced function table 12b obtained as above.

The database management unit 63 analyzes the structures of the CAD data 51 stored in the database 40, and supplies the result of the analysis to the graphical user interface (GUI) 64. In addition, the database management unit 63 manipulates files in the database 40 in response to a processing request from the graphical user interface (GUI) 64. For example, the database management unit 63 can make a deletion, copy, or the like of a file which contains data representing a shape of a part.

The graphical user interface (GUI) 64 generates an image which represents the structures of the CAD data 51 stored in the database 40, based on the result of the analysis made by the database management unit 63, and supplies the information on the image to the display device 81. In addition, the graphical user interface (GUI) 64 generates a command corresponding to an input signal from the input device 82. When the command generated by the graphical user interface (GUI) 64 is a request for manipulation of a file in the database 40, the graphical user interface (GUI) 64 transfers the command to the database management unit 63. Further, when the command generated by the graphical user interface (GUI) 64 is a processing request to one of the plurality of CAD-data processing units 71 to 73, the graphical user interface (GUI) 64 starts one of the CAD interfaces 91 to 93 corresponding to the one of the plurality of CAD-data processing units 71 to 73, and transfers the command to the one of the plurality of CAD interfaces 91 to 93.

Specifically, the graphical user interface (GUI) 64 determines one of the plurality of CAD-data processing units 71 to 73 corresponding to the type of CAD data to be processed. Then, the graphical user interface (GUI) 64 acquires from the interface table 12a a pointer to one of the plurality of function tables 12b corresponding to the one of the plurality of CAD-data processing units 71 to 73 determined as above. Next, the graphical user interface (GUI) 64 refers to the one of the plurality of function tables 12b which is pointed to by the acquired pointer, and acquires a pointer to a function (method) contained in the command. Then, the graphical user interface (GUI) 64 outputs a request for execution of the function (method) contained in the command, where the function (method) is stored at the location pointed to by the above pointer. Thus, the one of the plurality of plurality of CAD interfaces 91 to 93 corresponding to the one of the plurality of CAD-data processing units 71 to 73 is started, and the function (method) designated by the request for execution is executed.

Each of the plurality of CAD-data processing units 71 to 73 generates CAD data for three-dimensional CAD, in response to a user manipulation input. The CAD-data processing units 71 to 73 have respectively different functions, and generate CAD data having respectively different data structures. In addition, each of plurality of CAD-data processing units 71 to 73 performs processing in conjunction with the corresponding one of the plurality of CAD interfaces 91 to 93 when the CAD-data processing unit receives a request from the corresponding one of the plurality of CAD interfaces 91 to 93.

The display device 81 displays an image in accordance with image information transferred from the CAD-data management unit 60 or the like. The display device 81 is realized by, for example, the monitor 21 illustrated in FIG. 3. The input device 82 receives a manipulation input from the user who produces a CAD drawing, and transfers the user manipulation input to the CAD-data management unit 60. The input device 82 is realized by, for example, the keyboard 22 and the mouse 23 illustrated in FIG. 3.

The plurality of CAD interfaces 91 to 93 are provided corresponding to the plurality of CAD-data processing units 71 to 73, respectively. Each of the plurality of CAD interfaces 91 to 93 is a process of executing a function (method) which is defined in one of the plurality of CAD interface modules loaded in the RAM 12 by the interface-module loading unit 61. That is, each of the plurality of CAD interfaces 91 to 93 executes a function (method) corresponding to a command transferred from the graphical user interface (GUI) 64. Specifically, the graphical user interface (GUI) 64 transfers to a corresponding one of the plurality of CAD interfaces 91 to 93 a pointer which indicates the location of the function (method), and the corresponding one of the plurality of CAD interfaces 91 to 93 executes the function (method). Each of the plurality of CAD interfaces 91 to 93 executes the function (method) in conjunction with the corresponding one of the plurality of CAD-data processing units 71 to 73. That is, the linkage processing is performed. In order to perform the linkage processing, each of the plurality of CAD interfaces 91 to 93 sends a processing request to the corresponding one of the plurality of CAD-data processing units 71 to 73 in a manner defined in the function (method). That is, the contents and format of the processing request are defined in the function (method). When the corresponding one of the plurality of CAD-data processing units 71 to 73 receives the processing request, the CAD-data processing unit performs processing corresponding to the processing request. Thus, the linkage processing is achieved.

For example, the database 40 in the construction of FIG. 4 can be realized by the server computer 30 in FIG. 2, and the other elements in FIG. 4 can be realized by each of the client computers 10 and 10a in FIG. 2. When the database 40 is arranged in the server computer 30, the CAD data 41 can be shared by a plurality of client computers.

(4) Data Stored in RAM

Figure 5:
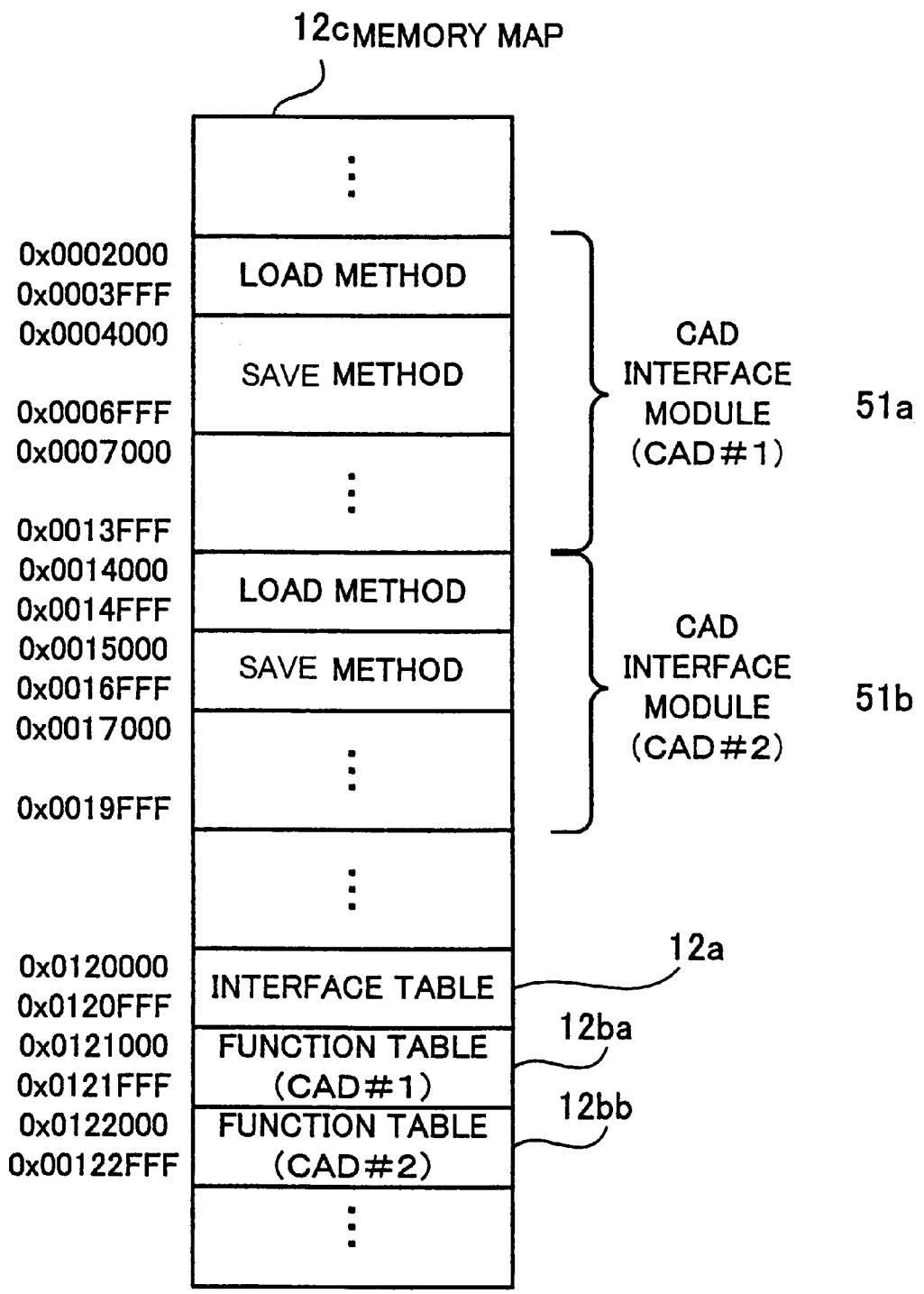
FIG. 5 is a diagram illustrating an example of a memory map of the RAM in the CAD-data management system in an embodiment of the present invention.

The contents of the RAM 12 are explained below. FIG. 5 is a diagram illustrating an example of a memory map of the RAM 12 in the CAD-data management system as the embodiment of the present invention. As indicated in the memory map 12c of FIG. 5, the RAM 12 stores CAD interface modules 51a and 51b, the interface table 12a, and function tables 12ba and 12bb. In FIG. 5, addresses are indicated in hexadecimal notation. In the example of FIG. 5, the CAD interface module 51a of the interface type "CAD#1" is stored in the address range from "0x0002000" to "0x0013FFF", and the CAD interface module 51b of the interface type "CAD#2" is stored in the address range from "0x0014000" to "0x0019FFF". Each of the CAD interface modules 51a and 51b is an aggregation of functions (methods). Each of the functions (methods) is a subroutine program in which a procedure for executing processing corresponding to a predetermined processing request, and returning a response is described. Each of the CAD interface modules 51a and 51b is a file, for example, having the form of a dynamic link library (DLL), and is stored in the hard disk drive (HDD) or the like.

In the example of FIG. 5, each of the CAD interface modules 51a and 51b includes a load method and a save method, where the load method is a function of making a CAD-data processing unit load CAD data, and the save method is a function of making the CAD-data processing unit save edited CAD data.

The interface table 12a is stored in the address range from "0x0120000" to "0x0120FFF", the function table 12ba for the interface type "CAD#1" is stored in the address range from "0x0122000" to "0x0122FFF", and the function table 12bb for the interface type "CAD#2" is stored in the address range from "0x0122000" to "0x0122FFF". For example, the interface table 12a and each of the function tables 12ba and 12bb, which are stored in the RAM 12, have the following data structures.

Figure 6:
FIG. 6 is a diagram illustrating an example of the interface table in the CAD-data management system in an embodiment of the present invention.

FIG. 6 is a diagram illustrating an example of the interface table 12a in the CAD-data management system as the embodiment of the present invention. The interface table 12a in FIG. 6 includes columns for the interface type and the pointer. Names of CAD-data processing units corresponding to CAD interface modules loaded in the RAM 12 are registered in the column for the interface type, and addresses of function tables in the CAD interface modules loaded in the RAM 12, corresponding to the names of the CAD-data processing units in the column for the interface type, are registered in the column for the pointer, where the addresses of the function tables are top addresses of areas in which the function tables are stored.

The interface table 12a in FIG. 6 indicates that the function table for the CAD interface module of the interface type "CAD#1" is stored in the address range beginning from "0x0121000", and the function table for the CAD interface module of the interface type "CAD#2" is stored in the address range beginning from "0x0122000".

Figure 7:
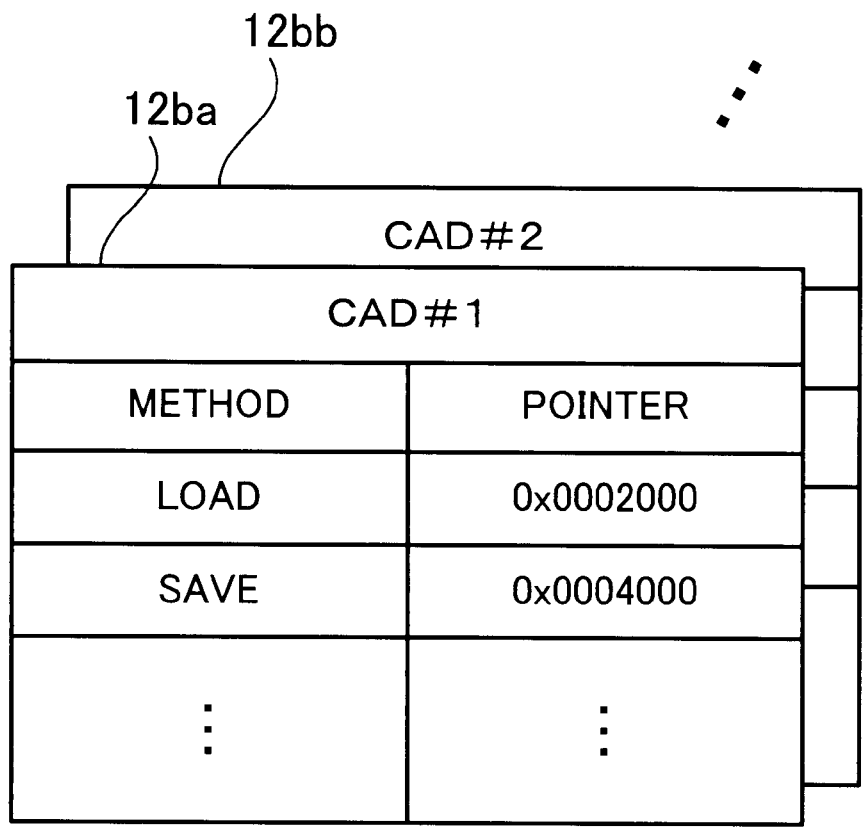
FIG. 7 is a diagram illustrating an example of a function table in the CAD-data management system in an embodiment of the present invention.

FIG. 7 is a diagram illustrating an example of each of the function tables 12ba and 12bb in the CAD-data management system as the embodiment of the present invention. Each of the function tables 12ba and 12bb in FIG. 7 includes columns for (a name of) a function and a pointer. The type of each function (method) is registered in the column for (the name of) the function table. In the example of FIG. 7, the types "load" and "save" are indicated in the column for (the name of) the function table. A pointer indicating a top address of an area in which each function (method) is stored is registered in the column for the pointer. In the example of FIG. 7, a pointer "0x0002000" to the load method and a pointer "0x0004000" to the save method are registered in the function table 12ba for the interface type "CAD#1".

(5) Flow of Loading CAD Interface Module

Figure 8:
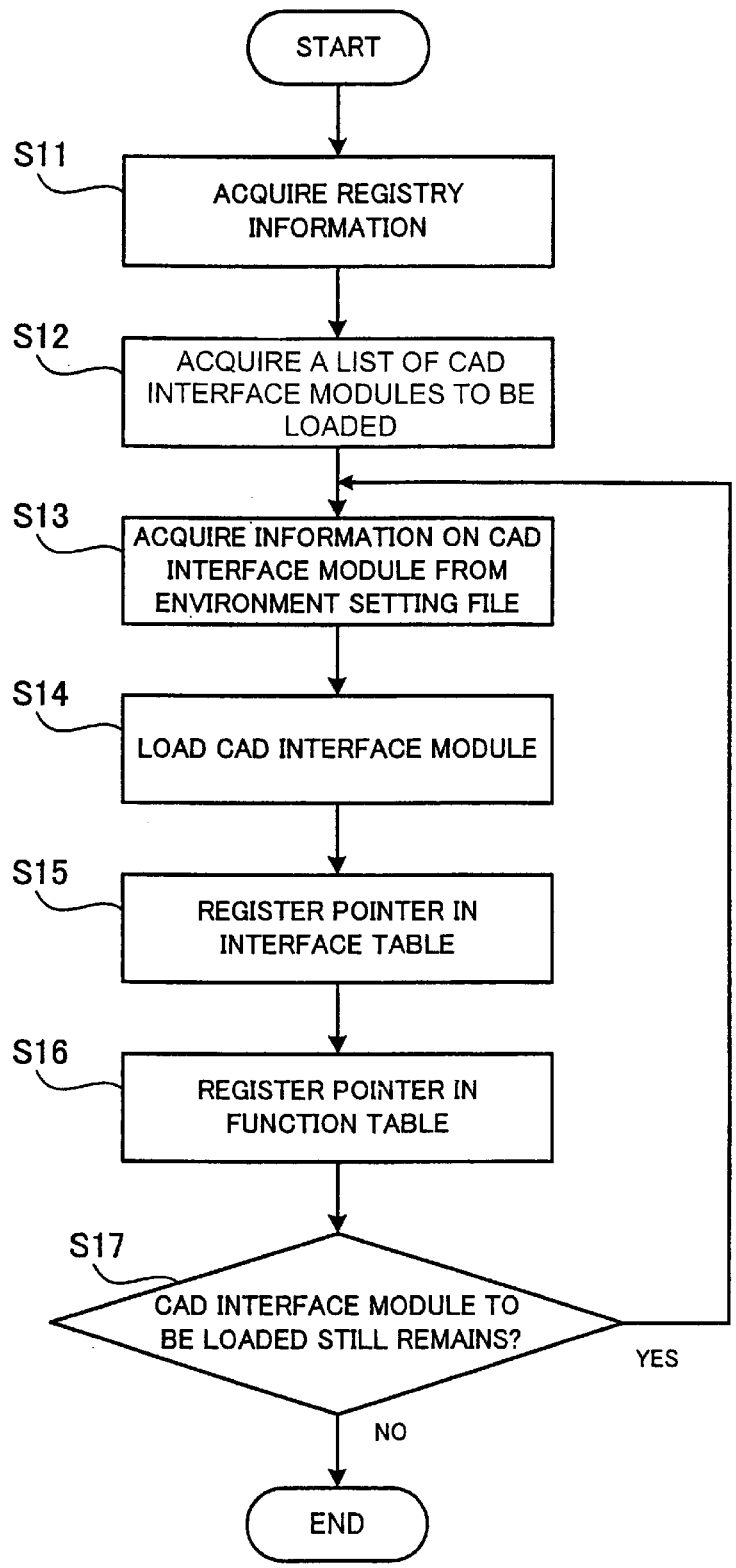
FIG. 8 is a flow diagram of a sequence of operations for loading a plurality of CAD interface modules in the RAM.

A sequence of operations for loading the plurality of CAD interfaces 91 to 93 in the RAM 12 is explained below with reference to FIG. 8. In the embodiment of the present invention, the following sequence of operations are performed when the CAD-data management unit 60 is started in a client computer.

In step S11, the interface-module loading unit 61 acquires registry information which is stored in the hard disk drive (HDD) in the computer.

In step S12, the interface-module loading unit 61 analyzes the acquired registry information, and acquires a list of at least one CAD interface module which is to be loaded.

In step S13, the interface-module loading unit 61 acquires information on each CAD interface module from the environment setting file, which is provided for each CAD interface module, and for example, a text file having an extension "ini". The acquired information includes a file name and an interface types of the CAD interface modules 51, where the file name of the CAD interface module 51 is, for example, a file name of a dynamic link library having an extension "dll", and the interface type is an information item indicating which CAD-data processing unit (CAD application) each CAD interface module corresponds to.

In step S14, the interface-module loading unit 61 reads out one of the CAD interface module from the interface module storage 50, and loads the CAD interface module in the RAM 12.

In step S15, the interface-module loading unit 61 secures a storage area in the RAM 12 for storing a function table for the CAD interface module loaded in step S14, and registers the top address of (pointer to) the secured storage area in the interface table.

In step S16, the interface-module loading unit 61 registers in a function table a top address of (pointer to) an area in which each function (method) in the loaded CAD interface module is stored.

In step S17, the interface-module loading unit 61 determines whether or not a CAD interface module which is to be loaded still remains. When yes is determined, the operation goes to step S13. When no is determined, the operation of FIG. 8 is completed.

Since the above loading operation is performed when the interface-module loading unit 61 starts up, a processing request (command) output from the CAD-data management unit 60 to one of a plurality of CAD-data processing units can be processed in a short time.

(6) Input of Command

The input of a command into the CAD data management unit 60 is explained below. In the embodiment of the present invention, the graphical user interface (GUI) 64 analyzes an input from the input device 82, and generates a processing request (command). The user can designate an object (data of a part or data of an assembly) to be processed, by selecting an arbitrary data item from a structure of an assembly which is displayed on a screen.

Figure 9:
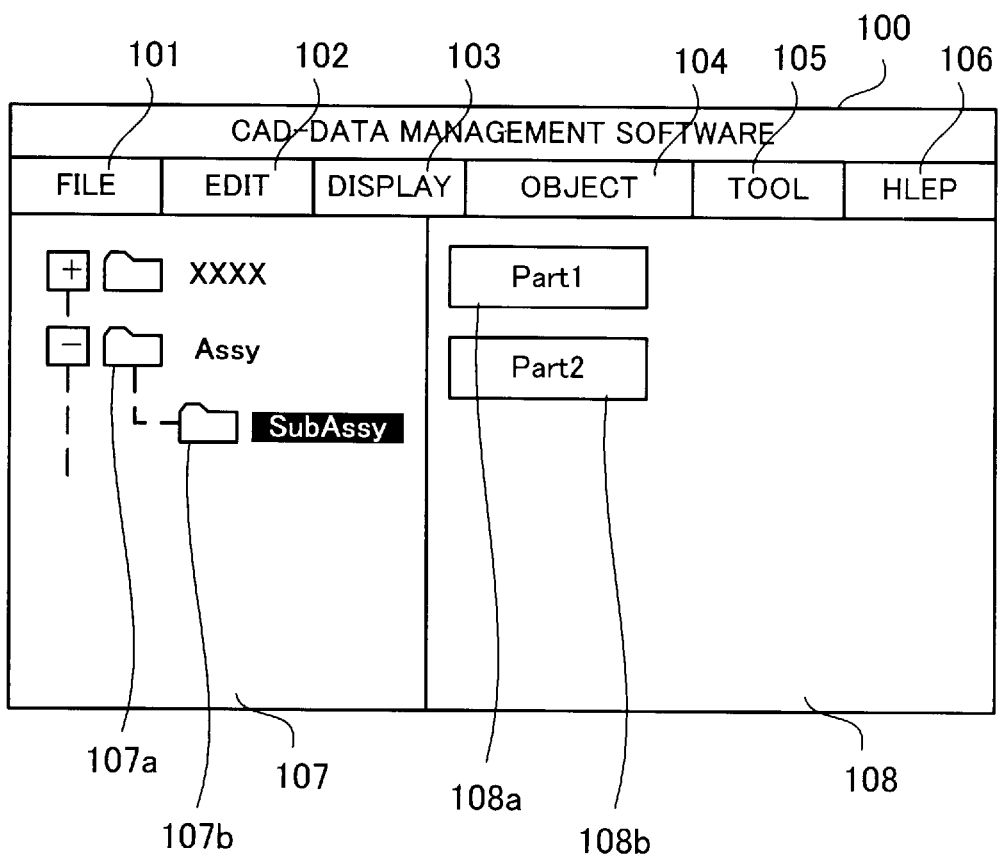
FIG. 9 is a diagram illustrating an example of a window displaying a structure of an assembly of data items.

FIG. 9 is a diagram illustrating an example of a window displaying a structure of an assembly. A plurality of menus 101 to 106 are arranged in the upper portion of the window 100. The "File" menu 101 includes menu items such as a data load command, the "Edit" menu 102 includes menu items such as a file copy command, the "Display" menu 103 includes menu items for setting screen display conditions and the like, and the "Object" menu 104 includes menu items such as a command to set an object in an exclusive mode (i.e., forbidding manipulation, such as updating, of the object by another user) and a command to cancel the setting in the exclusive mode, where the object is a constituent (unit, subunit, or part) of a product which is defined by CAD data. The "Tool" menu 105 includes menu items such as a command to customize the menu bar, and the "Help" menu 106 includes menu items for starting help functions such as a function of displaying an on-line manual.

A data-structure display area 107 is arranged in the left column under the menu bar, and the structure of data items stored in the database 40 are indicated in the data-structure display area 107. In the example of FIG. 9, the data-structure display area 107 indicates that a subassembly 107b having a name "SubAssy" exists as a substructure of an assembly 107a having a name "Assy".

A data-item display area 108 is arranged in the right column under the menu bar, and data items constituting an assembly selected in the data-structure display area 107 are displayed in the data-item display area 108. Since the subassembly 107b is selected in the data-structure display area 107 in the example of FIG. 9, data parts 108a and 108b which constitute the subassembly 107b are indicated in the data-item display area 108.

The database management unit 63 and the graphical user interface (GUI) 64 perform processing for displaying the structure of the CAD data as illustrated in FIG. 9. Specifically, the database management unit 63 analyzes the contents of the CAD data 41 stored in the database 40, and the graphical user interface (GUI) 64 controls the display device 81 so as to display the image as illustrated in FIG. 9, based on the tree structure of the CAD data 41 which is recognized as a result of the analysis by the database management unit 63.

When a user selects at least one object in the CAD data displayed, for example, as illustrated in FIG. 9, and inputs a data load command, the data of the selected object can be loaded in a client computer. For example, the data load command is input when the user chooses a menu item corresponding to the data load command in the "File" menu 101 in the window 100 of FIG. 9, which is provided by the graphical user interface (GUI) 64.

Figure 10:
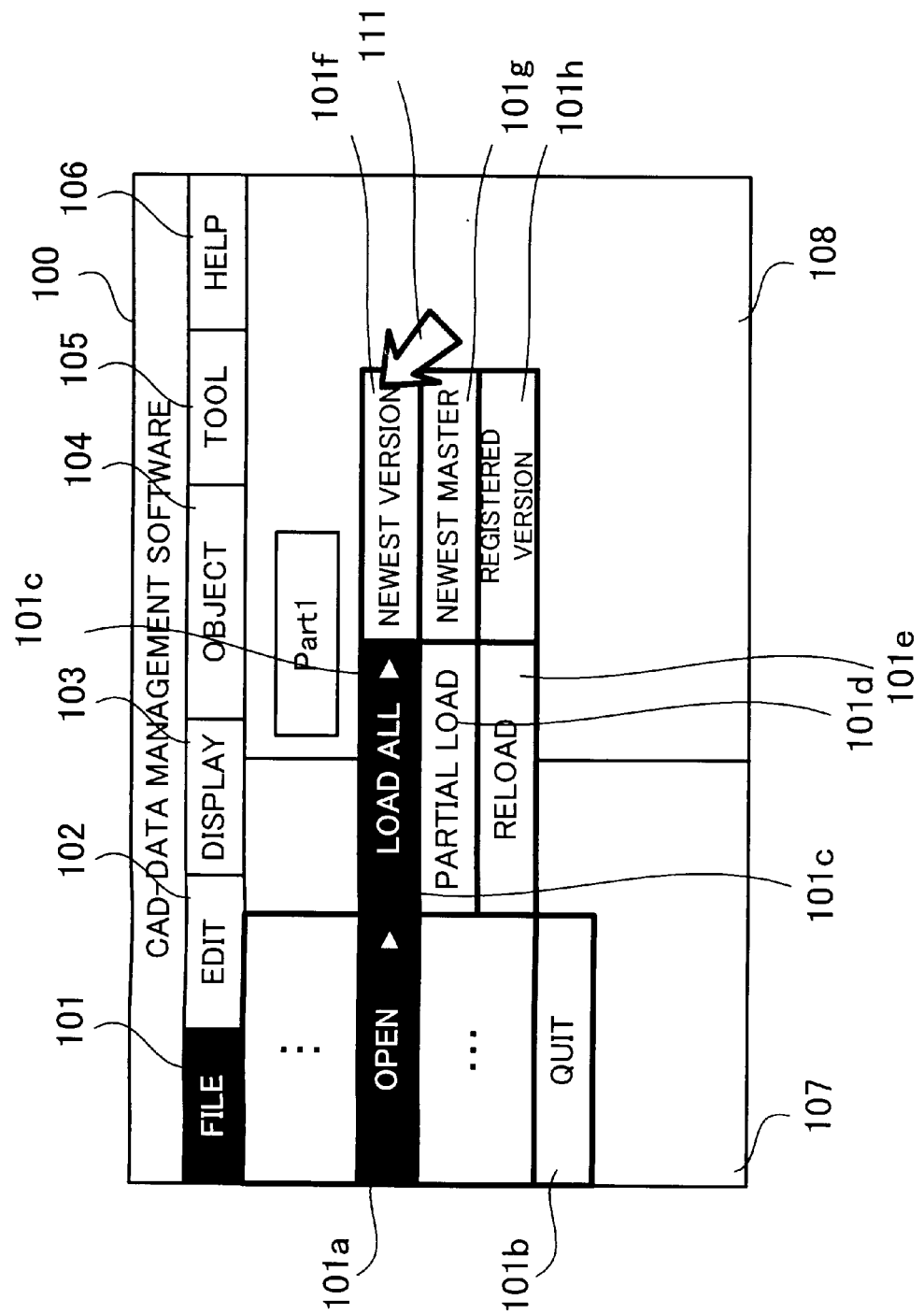
FIG. 10 is a diagram illustrating an example of a window which is displayed when a user inputs a command to load at least one CAD data item.

FIG. 10 is a diagram illustrating an example of the window 100 which is displayed when a user inputs a command to load at least one item of CAD data. In the example of FIG. 10, the data load command can be input when the user moves a cursor by using a pointing device, e.g., when the user moves a mouse cursor 111 by manipulating a mouse, so as to choose at least one desired command as explained below in detail.

When the user selects the "File" menu 101 by manipulating the mouse on the name of the "File" menu 101 in the menu bar, a pull-down menu is opened, where the pull-down menu is comprised of menu items including an "Open" command 101a and a "Quit" command 101b. The "Open" command 101a is provided for loading CAD data, and the "Quit" command 101b is provided for quitting the operation of the CAD-data management unit 60.

When the user chooses the "Open" command 101a, a first submenu (pop-up menu) provided for choosing a load type is opened. The first submenu includes as menu items a "Load All" command 101c, a "Partial Load" command 101d, and a "Reload" command 101e.

The "Load All" command 101c is provided for loading all CAD data relating to a product which a selected object belongs to. For example, when the "Load All" command 101c is chosen while a subassembly is selected, all CAD data of a product including the selected subassembly are loaded, where the loaded CAD data include CAD data of an assembly in the top layer and CAD data of all subassemblies and parts under the assembly in the top layer.

The "Partial Load" command 101d is provided for loading a portion of CAD data of a product. For example, when the "Partial Load" command 101d is chosen while a subassembly is selected, CAD data of the selected subassembly and other subassemblies under the selected subassembly are loaded.

The "Reload" command 101e is provided for reloading a new version of CAD data when an older version of the CAD data is currently referred to. For example, a first designer may change CAD data of a part after a second designer has loaded CAD data of the part. In this case, the second designer can display the changed CAD data by choosing the "Reload" command 101e.

When the "Load All" command 101c is chosen, a second submenu (pop-up menu) is opened. The second submenu includes as menu items a "Load Newest Version" command 101f, a "Load Newest Master" command 101g, and a "Load Registered Version" command 101h.

When the "Load Newest Version" command 101f is chosen while an object is selected, a newest version of CAD data of the selected object is loaded. When the "Load Newest Master" command 101g is chosen while an object is selected, a newest version, among approved versions, of CAD data of the selected object is loaded. When the "Load Registered Version" command 101h is chosen while an object is selected, a registered version of CAD data of the selected object is loaded, where the registered version is a version indicated by registration information which is included in data of the selected object.

A submenu similar to the above second submenu is opened when the "Partial Load" command 101*d* is chosen.

As described above, a load command can be input when a user chooses at least one desired command in the above window 100. When the load command is input as above, the graphical user interface (GUI) 64 generates a processing request corresponding to the load command. Then, processing for calling a CAD interface is executed.

(7) Flow of Calling CAD Interface

Figure 11:
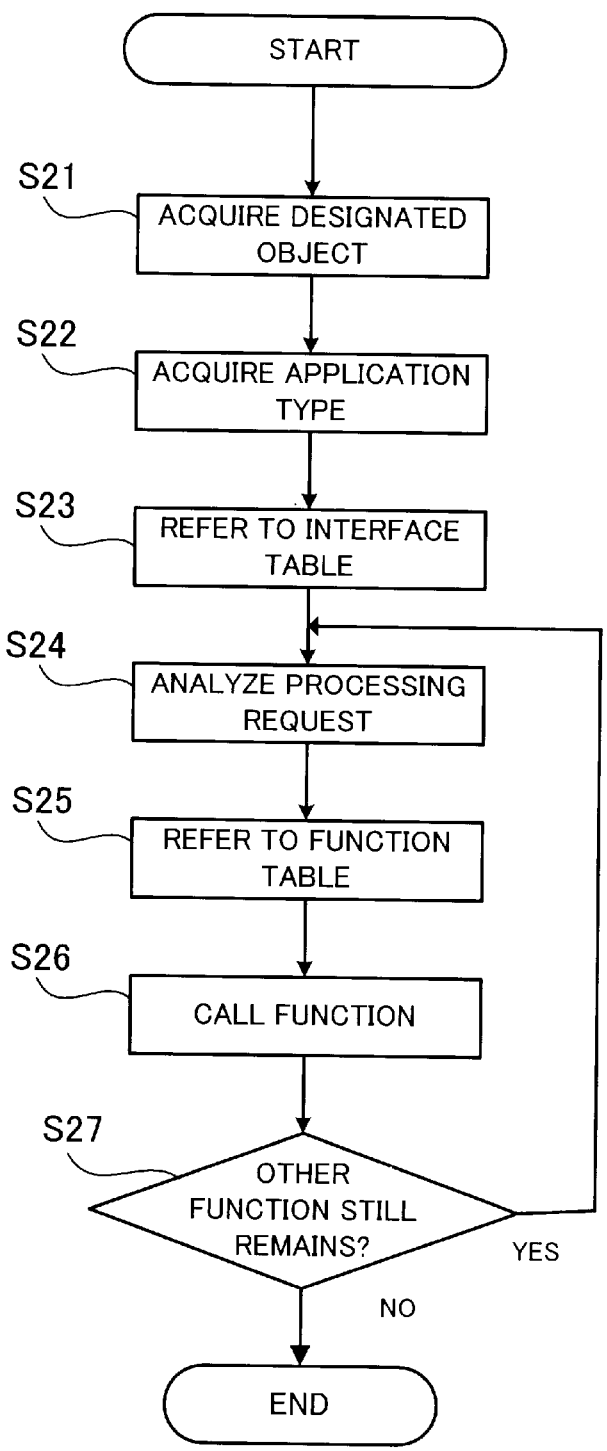
FIG. 11 is a flow diagram illustrating a sequence of operations performed for calling a CAD interface.

A sequence of operations performed for calling a CAD interface is explained below with reference to FIG. 11.

In step S21, the graphical user interface (GUI) 64 acquires a designated object from the database 40. In step S22, the graphical user interface (GUI) 64 extracts an application type from the acquired object, where the application type is included in the acquired object as an attribute of the acquired object. The application type is an information item which indicates which CAD-data processing unit (CAD application) can handle the object. A processing request is generated by attaching the designated object and the application type as parameters, to the command input by the user.

In step S23, the graphical user interface (GUI) 64 refers to the interface table 12*a*, and acquires a pointer for a CAD application corresponding to the application type obtained in step S22, where the pointer indicates the location (top address) of a function table corresponding to the CAD application.

In step S24, the graphical user interface (GUI) 64 analyzes the processing request, and determines at least one function to be executed. When the processing request is executed by only one function, the only one function is determined to be the function to be executed. When the processing request is executed by a plurality of functions, one of the plurality of functions which should be first executed is determined to be the function to be executed. For example, when a return value of a first function is used in execution of a second function, execution of the first function should precede the execution of the second function.

In step S25, the graphical user interface (GUI) 64 searches for the function determined in step S24, in the function table pointed to by the pointer acquired in step S23.

In step S26, the graphical user interface (GUI) 64 calls the function pointed to by the pointer obtained in step S25. When the function is called, the operating system (OS) generates as a process a CAD interface in order to execute the function, and the generated CAD interface executes the function in conjunction with the CAD-data processing unit. The return value of the function is returned to the graphical user interface (GUI) 64.

In step S27, the graphical user interface (GUI) 64 determines whether or not any other function which is to be executed still remains. When yes is determined, the operation goes to step S24. When no is determined, the sequence of FIG. 11 is completed.

As explained above, the command input into the CAD-data management unit 60 can be executed in conjunction with the CAD-data processing unit through the CAD interface.

Incidentally, each command which can be input through the graphical user interface (GUI) 64 may be common to all of the plurality of CAD-data processing units 71 to 73 or unique to one of the plurality of CAD-data processing units 71 to 73. The formalities of function calls corresponding to commands which are common to all of the plurality of CAD-data processing units 71 to 73 are predetermined. On the other hand, when a command input through the graphical user interface (GUI) 64 is unique to one of the plurality of CAD-data processing units 71 to 73, the graphical user interface (GUI) 64 is designed to call a module (function) provided for processing an unreserved command. At this time, a process name is passed to the function as a parameter of the unreserved command. The called function executes processing corresponding to the received process name. Thus, processes which are unique to each of the plurality of CAD-data processing units 71 to 73 can be executed.

As explained above, in the present embodiment, the types of the processing requests, which are output from the CAD data management unit 60 to functions, are predetermined. Therefore, the contents of the functions corresponding to the respective processing requests can be defined according to the functions of the CAD-data processing units, by developers of the CAD interfaces.

Since the functions are executed by the CAD interfaces, it is not necessary to make a great number of arrangement between the CAD-data management unit 60 and the CAD interfaces. Therefore, the development of the CAD interfaces is easy.

In the above embodiment, the CAD interfaces are each generated as an independent process, and messages are exchanged as inter-process communication between the CAD-data management unit 60 and the respective CAD interfaces. Since the respective CAD interfaces are executed as independent processes, a plurality of processing requests each designating a different type of CAD data can be processed in parallel.

(8) Inquiry about Data Type

In the above explanations, it is assumed that the type of each CAD data item is defined in advance. Therefore, it is necessary to set information on (attribute of) the type for each CAD data item when the CAD data item is newly registered. However, alternatively, it is possible to provide in each CAD interface module a function (method) of determining whether or not the CAD interface can handle each CAD data item. In this case, it is possible to determine a CAD interface module which can handle a selected CAD data item.

For example, a function (method) "IsMydata" can be defined at the top of each CAD interface module, where the function (method) "IsMydata" determines whether or not the CAD interface module can handle each CAD data item. When a command designating a CAD data item is input, the graphical user interface (GUI) 64 inquires of the function (method) "IsMydata" arranged at the top of each CAD interface module whether or not the CAD interface module can handle the CAD data item. Then, the graphical user interface (GUI) 64 sends a request for executing the command to a CAD interface module which returns a positive response to the inquiry.

Figure 12:
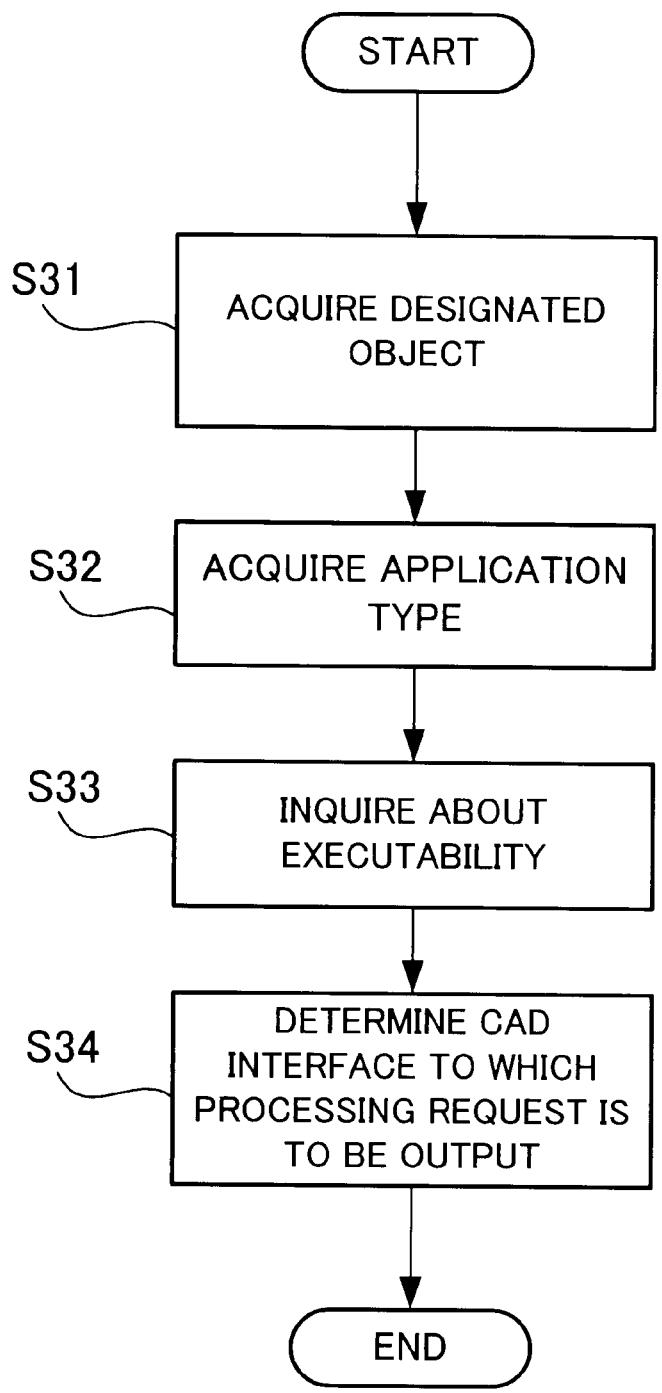
FIG. 12 is a flow diagram of a sequence of operations for determining, by inquiry, one of a plurality of CAD interfaces which executes a processing request.

FIG. 12 is a flow diagram of a sequence of operations for determining, by inquiry, one of a plurality of CAD interfaces which executes a processing request.

In step S31, the graphical user interface (GUI) 64 acquires a designated object from the database 40, where the designated object means an object which is selected in the window 100 by a user.

In step S32, the graphical user interface (GUI) 64 extracts an application type from the acquired object, where the application type is included in the acquired object as an attribute of the acquired object.

In step S33, the graphical user interface (GUI) 64 refers to the interface table and each function table in order to obtain the location of the function (method) "IsMydata" in each of the plurality of CAD interface modules. As mentioned before, the function (method) "IsMydata" is arranged at the top of each of the plurality of CAD interface modules. Then, the graphical user interface (GUI) 64 inquires of the function (method) "IsMydata" in each CAD interface module whether or not the CAD interface module can handle the designated object. Thus, each CAD interface is started, and the function (method) "IsMydata" is executed in each CAD interface. The result of the execution is returned to the graphical user interface (GUI) 64. For example, data "1" is returned to the graphical user interface (GUI) 64 when the CAD interface module can handle the designated object, and data "0" is returned to the graphical user interface (GUI) 64 when the CAD interface module cannot handle the designated object.

In step S34, the graphical user interface (GUI) 64 determines one of the plurality of CAD interfaces which returns a positive response to the inquiry, as a CAD interface to which a processing request is to be passed.

As explained above, the graphical user interface (GUI) 64 can determine a CAD interface which can handle each CAD data item by using the function (method) "IsMydata" arranged at the top of each CAD interface module.

(9) CAD Interface Module as Device Driver

In the above explanations, the CAD interface module is stored in the form of a dynamic link library. However, the CAD interface module can be incorporated in the operating system (OS) in the form of a device driver.

For example, a CAD interface module corresponding to each CAD-data processing unit (CAD application) is installed in each client computer as a device driver. At this time, a drive as an "Unknown Drive" is assigned to the CAD interface module. The graphical user interface (GUI) 64 in the CAD-data management unit 60 having a processing request to a CAD-data processing unit requests the drive corresponding to the CAD-data processing unit to execute the processing request. Thus, processing corresponding to each CAD-data processing unit can be executed.

(10) Server for Each CAD-Data Processing Unit

It is possible to provide a server for each CAD-data processing unit, where the server executes processing corresponding to the CAD-data processing unit. In this case, the graphical user interface (GUI) 64 in the CAD-data management unit 60 in a client computer having a processing request to a CAD-data processing unit requests a server corresponding to the CAD-data processing unit to execute the processing request. The server executes the processing request, and returns a result of the execution to the graphical user interface (GUI) 64 in the client computer.

(11) Dynamically Changeable Command Menu

In the above embodiment, the CAD-data management unit 60 can analyze the structures of a plurality of types of CAD data, and display the analyzed structures on the screen. Therefore, users can select a desired object of CAD data, and designate a command in the command menu (e.g., the aforementioned menus 101 to 106). In response to the selection of the desired object and the input of the command, a processing request corresponding to the designated command is sent to a CAD-data processing unit which can handle the selected object.

However, the command menu may include a command which only a portion of a plurality of CAD-data processing units can execute. When an object is selected on the screen, one or more commands which cannot be executed by (i.e., is not compatible with) a CAD-data processing unit corresponding to the selected object can be invalidated in the command menu.

Figure 13:
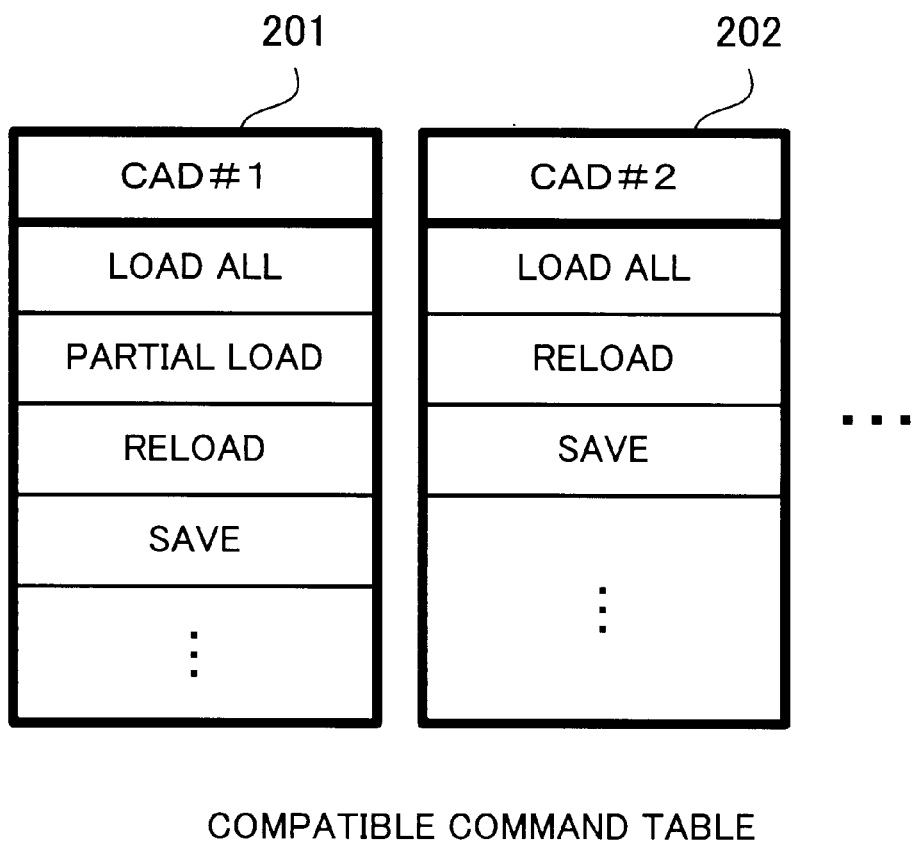
FIG. 13 is a diagram illustrating examples of compatible command lists.

For example, a list of compatible commands can be defined at the top of a CAD interface module corresponding to each CAD-data processing unit, where the compatible commands means the commands which can be executed by the CAD-data processing unit. FIG. 13 is a diagram illustrating examples of compatible command lists. In this example, compatible command lists 201 and 202 are provided for the CAD-data processing units "CAD#1" and "CAD#2", respectively. The compatible command list 201 corresponding to the CAD-data processing unit "CAD#1" includes the commands "Load All", "Partial Load", "Reload", "Save", and the like. That is, the compatible command list 201 indicates that the CAD-data processing unit "CAD#1" can execute the commands "Load All", "Partial Load", "Reload", "Save", and the like. The compatible command list 202 corresponding to the CAD-data processing unit "CAD#2" includes the commands "Load All", "Reload", "Save", and the like. That is, the compatible command list 202 indicates that the CAD-data processing unit "CAD#2" can execute the commands "Load All", "Reload", "Save", and the like. That is, the CAD-data processing unit "CAD#2" cannot execute the "Partial Load" command. Therefore, when a CAD data item which corresponds to the CAD-data processing unit "CAD#2" is selected, the graphical user interface (GUI) 64 in the CAD-data management unit 60 invalidates the "Partial Load" command in the command menu. The invalidation of the incompatible command may be realized by deletion of the incompatible command in the command menu. Alternatively, the indication of the incompatible command may be dimmed, i.e., the color or brightness of the indication of the incompatible command may be made close to the color or brightness of the background.

Figure 14:
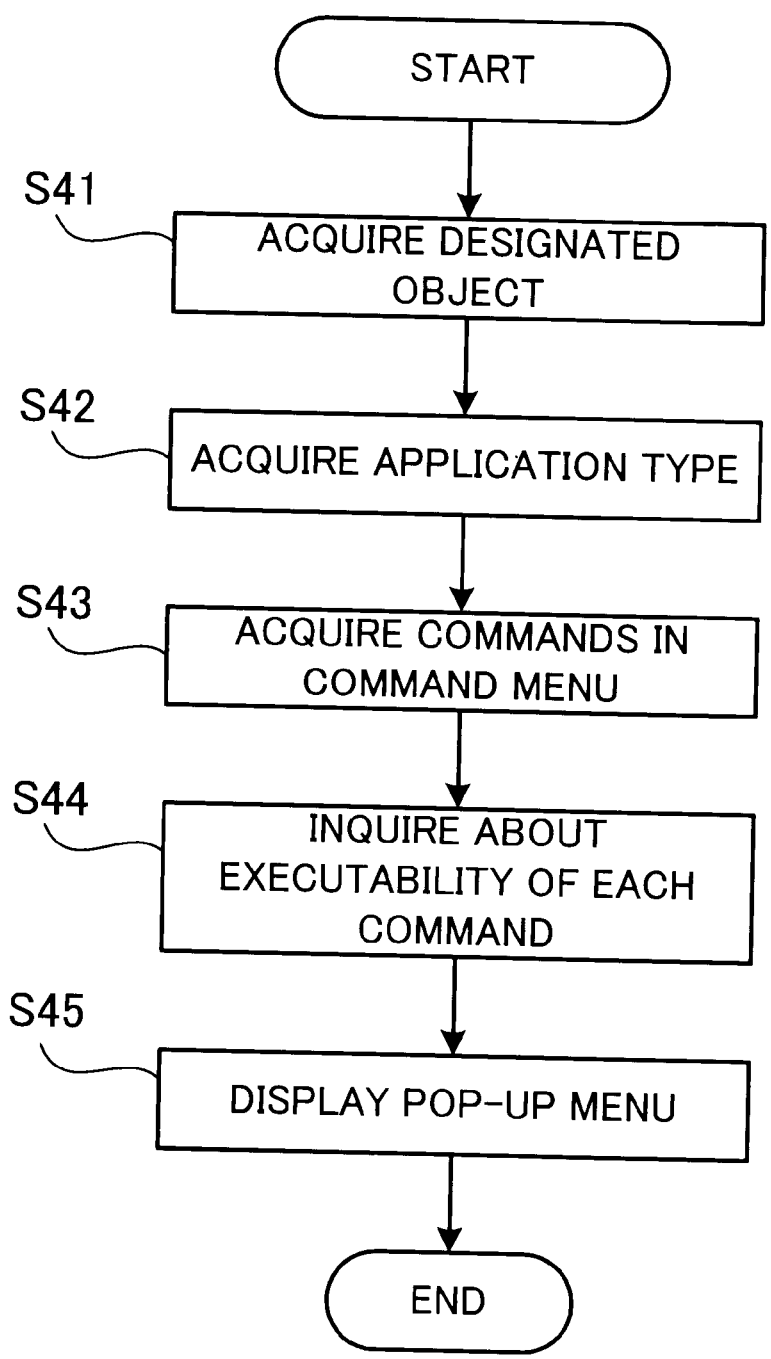
FIG. 14 is a flow diagram of a sequence of operations for displaying a command menu.

FIG. 14 is a flow diagram of a sequence of operations for displaying the command menu.

In step S41, the graphical user interface (GUI) 64 acquires a designated object from the database 40. In step S42, the graphical user interface (GUI) 64 extracts an application type from the acquired object, where the application type is included in the acquired object as an attribute of the acquired object.

In step S43, the graphical user interface (GUI) 64 acquires a list of commands to be indicated in a command menu (pop-up menu) corresponding to a user manipulation input.

In step S44, the graphical user interface (GUI) 64 refers to a compatible command table (list) of a CAD-data processing unit corresponding to a designated object, and determines whether or not each of the commands in the list acquired in step S43 can be executed by the CAD-data processing unit, where only commands included in the compatible command table can be executed by the CAD-data processing unit.

In step S45, the graphical user interface (GUI) 64 displays the pop-up menu so that only one or more commands which are determined in step S44 to be executable can be chosen in the pop-up menu.

As explained above, the contents of the command menu (pop-up menu) can be dynamically changed according to the type of a selected CAD data item.

In addition, it is possible to define a function (method) of acquiring as a list of menu items a list of functions compatible with each CAD data processing unit, at the top of a CAD interface module corresponding to the CAD data processing unit. In this case, when the graphical user interface (GUI) 64 displays a menu, the graphical user interface (GUI) 64 calls the above function (method) of acquiring the list of menu items, and obtains the list of menu items as a return value. Then, the graphical user interface (GUI) 64 dynamically changes the contents of the pop-up menu based on the return value.

Further, the graphical user interface (GUI) 64 may inquire of each CAD interface about compatibility of each of commands included in a menu with a CAD data processing unit corresponding to the CAD interface, when the menu is designed to be displayed by the CAD-data management unit 60 as standard. For example, it is possible to define in each CAD interface a function (method) of responding to the inquiry about the compatibility of each command. When the graphical user interface (GUI) 64 displays a command menu on the screen, the graphical user interface (GUI) 64 inquires of a CAD interface corresponding to a selected object whether or not the CAD interface can execute each of commands included in the above menu. Then, the graphical user interface (GUI) 64 displays the command menu (such as a pop-up menu) so that only at least one command for which a positive response to the inquiry is returned can be chosen in the command menu.

(12) Message Display Corresponding to CAD Data Type

In the above embodiment, a plurality of types of CAD data can be processed through the graphical user interface (GUI) 64 in the CAD-data management unit 60. However, an identical thing is often called differently in different CAD-data processing units (CAD applications). Therefore, a message file is provided in the CAD-data management unit 60 for each type of CAD data. When the graphical user interface (GUI) 64 handles CAD data, the graphical user interface (GUI) 64 acquires a message from the message file corresponding to the type of the CAD data, and displays the message. Thus, the graphical user interface (GUI) 64 can display a message corresponding to the type of an object (part or assembly) to be processed, even when the processing of the object is performed within the CAD-data management unit 60.

(13) Processing Independent of CAD-data Processing Unit

The CAD-data management unit 60 has functions which are independent of the CAD-data processing units. For example, the operation of environment setting for a server access or the like can be performed independently of the CAD-data processing units. Therefore, an identifier for determining whether or not a command in a command menu is dependent on the CAD-data processing units can be provided in a menu definition file. In this case, when a designated command can be executed independently of the CAD-data processing units, the graphical user interface (GUI) 64 calls a fixed module for executing the designated command, where the fixed module is provided separately from the CAD interface modules corresponding to the CAD-data processing units.

(14) Program in Storage Medium

The functions of the CAD-data management system according to the present invention or the client computer in the embodiment of the present invention can be realized by a computer. The functions of the CAD-data management system or the client computer can be written as a program, which can be stored in a computer-readable storage medium. The functions can be realized by executing the program in the computer. The computer-readable storage medium may be a magnetic storage device, a semiconductor memory, or the like. In order to put the program into the market, the program may be stored in a portable storage medium such as a CD-ROM (compact-disk read-only memory) and a floppy disc. Alternatively, the program can be stored in a storage device belonging to a first computer, and transferred to a second computer connected through a network to the first computer. When the program is executed by a computer, the program can be stored in a hard disk drive or the like belonging to the computer, and loaded into a main memory of the computer.

(15) Other Matters (i) The foregoing is considered as illustrative only of the principle of the present invention. Further, since numerous modifications and changes will be apparent to those skilled in the art, it is not desired to limit the invention to the exact construction and applications shown and described, and accordingly, all suitable modifications and equivalents may be regarded as falling within the scope of the invention in the appended claims and their equivalents.

(ii) All of the contents of the Japanese patent application, No.2000-395662 are incorporated into this specification by reference.

What is claimed is:

1. A method for managing CAD data by using a CAD-data processing function being capable of processing a predetermined type of CAD data from among a plurality of types of CAD-data, each of the plurality of types of CAD-data corresponding to at least one of a plurality of CAD applications, comprising:

receiving a manipulation input designating the predetermined type of CAD data from among the plurality of types of CAD-data, each of the plurality of types of CAD-data corresponding to at least one of the plurality of CAD applications;

generating a processing request corresponding to the manipulation input and being directed to the CAD-data processing function; and executing processing defined in an interface function in conjunction with the CAD-data processing function, wherein the interface function is predefined corresponding to the processing request.

2. A method for managing a plurality of types of CAD data, each of the plurality of types of CAD-data corresponding to at least one of a plurality of CAD applications, by using a plurality of CAD-data processing functions, wherein each of the plurality of CAD-data processing functions is capable of processing one of a plurality of predetermined types of CAD data, comprising:

receiving a manipulation input designating one of the plurality of predetermined types of CAD data, wherein each of the plurality of types of CAD-data corresponds to at least one of the plurality of CAD applications;

generating a processing request corresponding to the manipulation input and being directed to one of the plurality of CAD-data processing functions that is capable of processing one of the plurality of predetermined types of CAD data; and executing processing defined in an interface function in conjunction with the one of the plurality of CAD-data processing functions, wherein the interface function is predefined corresponding to the processing request.

3. A CAD-data management system for managing CAD data, comprising:

a CAD-data processing unit to process a predetermined type of CAD data from among a plurality of types of CAD-data, each of the plurality of types of CAD-data corresponding to at least one of a plurality of CAD applications;

a processing-request generation unit to receive a manipulation input designating the predetermined type of CAD data, and to generate a processing request corresponding to the manipulation input and being directed to the CAD-data processing unit; and a linkage processing unit to execute processing defined in a function in conjunction with the CAD-data processing unit, wherein the function is predefined corresponding to the processing request.

4. A CAD-data management system for managing a plurality of types of CAD data, each of the plurality of types of CAD-data corresponding to at least one of a plurality of CAD applications, comprising:

a plurality of CAD-data processing units, wherein each of the plurality is to process one of a plurality of predetermined types of CAD data, wherein each of the plurality of types of CAD-data corresponds to at least one of the plurality of CAD applications;

a processing-request generation unit to receive a manipulation input designating one of the plurality of predetermined types of CAD data, and to generate a processing request corresponding to the manipulation input and being directed to one of the plurality of CAD-data processing units that is capable of processing one of the plurality of predetermined types of CAD data; and a linkage processing unit to execute processing defined in a function in conjunction with the one of the plurality of CAD-data processing units, wherein the function is predefined corresponding to the processing request.

5. A computer-readable storage medium storing a program which is to be executed by a computer, and realizes a CAD-data management system for managing CAD data, comprising:

a CAD-data processing unit to process a predetermined type of CAD data from among a plurality of types of CAD-data, each of the plurality of types of CAD-data corresponding to at least one of a plurality of CAD applications;

a processing-request generation unit to receive a manipulation input designating the predetermined type of CAD data, and generates a processing request corresponding to said manipulation input and being directed to said CAD-data processing unit; and a linkage processing unit which executes processing defined in a function in conjunction with said CAD-data processing unit, where said function is predefined corresponding to said processing request.

6. A computer-readable storage medium storing a program which is to be executed by a computer, and realizes a CAD-data management system for managing a plurality of types of CAD data, each of the plurality of types of CAD-data corresponding to at least one of a plurality of CAD applications, comprising:

a plurality of CAD-data processing units, wherein each of the plurality is to process one of a plurality of predetermined types of CAD data, wherein each of the plurality of types of CAD-data corresponds to at least one of the plurality of CAD applications;

a processing-request generation unit to receive a manipulation input designating one of the plurality of predetermined types of CAD data, and to generate a processing request corresponding to the manipulation input and being directed to one of the plurality of CAD-data processing units that is capable of processing one of the plurality of predetermined types of CAD data; and a linkage processing unit to execute processing defined in a first function in conjunction with the one of the plurality of CAD-data processing units, wherein the first function is predefined corresponding to the processing request.

7. A computer-readable storage medium according to claim 6, wherein said CAD-data management system further comprises a data-structure displaying unit to display a data structure of a plurality of CAD data items so that a user can select at least a portion of the plurality of CAD data items as the CAD data designated by the manipulation input, wherein the processing-request generation unit recognizes the at least a portion of the plurality of CAD data items based on the manipulation input.

8. A computer-readable storage medium according to claim 6, wherein the CAD-data management system further comprises:

a memory;

a loading unit to load in the memory a plurality of second functions including the first function and corresponding to a plurality of processing requests that can be generated by the processing-request generation unit;

a pointer table; and a pointer registration unit to register in the pointer table a plurality of pointers, wherein each of the plurality of pointers points to one of a plurality of locations in which one of the plurality of second functions are loaded in the memory, wherein the linkage processing unit locates the first function based on one of the plurality of pointers.

9. A computer-readable storage medium according to claim 8, wherein the plurality of second functions is included in a plurality of modules corresponding to the plurality of CAD-data processing units, and wherein the loading unit loads the plurality of modules in the memory.

10. A computer-readable storage medium according to claim 9, wherein each of the plurality of modules includes a function for responding to an inquiry about a type of CAD data that one of the plurality of CAD-data processing units corresponding to the each of the plurality of modules can process.

11. A computer-readable storage medium according to claim 6, wherein the processing-request generation unit outputs an inquiry about processing that can be executed by one of the plurality of CAD-data processing units, and wherein the processing-request generation unit displays a menu on a screen according to a response to the inquiry, wherein the menu includes items of processing that one of the plurality of CAD-data processing units can execute.

* * * * *